(12) United States Patent
Aoyama et al.

(10) Patent No.: US 7,525,263 B2
(45) Date of Patent: Apr. 28, 2009

(54) CONTROL SYSTEM

(75) Inventors: Kazunari Aoyama, Yamanashi (JP);
Minoru Nakamura, Fujiyoshida (JP);
Takaaki Komatsu, Yamanashi (JP)

(73) Assignee: Fanuc Ltd, Yamanashi (JP)

( * ) Notice: Subject to any disclaimer, the term of this patent is extended or adjusted under 35 U.S.C. 154(b) by 19 days.

(21) Appl. No.: 11/703,239

(22) Filed: Feb. 7, 2007

(65) Prior Publication Data
US 2007/0188116 A1 Aug. 16, 2007

(30) Foreign Application Priority Data
Feb. 14, 2006 (JP) .............................. 2006-036847

(51) Int. Cl.
*H02P 5/46* (2006.01)
(52) U.S. Cl. .............................. 318/77; 318/34; 318/66; 318/68
(58) Field of Classification Search .................. 318/77, 318/34, 66, 68; 700/3, 2, 5
See application file for complete search history.

(56) References Cited

U.S. PATENT DOCUMENTS

| 5,159,503 | A | | 10/1992 | Mitamura et al. | |
|---|---|---|---|---|---|
| 5,283,506 | A | * | 2/1994 | Hoffmann et al. ............. | 318/77 |
| 5,777,870 | A | * | 7/1998 | Takaku et al. .................. | 700/3 |
| 5,988,846 | A | * | 11/1999 | Flamm et al. .................. | 700/8 |
| 6,474,227 | B2 | * | 11/2002 | Narita .......................... | 100/35 |
| 6,603,830 | B1 | | 8/2003 | Finsterbusch et al. | |
| 6,792,063 | B1 | | 9/2004 | Ogura | |
| 7,010,359 | B2 | * | 3/2006 | Faulhammer et al. .......... | 700/3 |
| 2002/0111696 | A1 | * | 8/2002 | Albrecht et al. ................ | 700/3 |
| 2003/0191544 | A1 | * | 10/2003 | Faulhammer et al. .......... | 700/3 |
| 2006/0197476 | A1 | | 9/2006 | Aoyama et al. | |

FOREIGN PATENT DOCUMENTS

| CN | 1291333 | | 4/2001 |
|---|---|---|---|
| DE | 1032117 | * | 8/2000 |
| JP | 04-135210 | | 5/1992 |
| JP | 2001-358793 | | 12/2001 |
| JP | 2005-14150 | | 1/2005 |
| JP | 2006-244264 | | 9/2006 |
| JP | 2007-58736 | | 3/2007 |

OTHER PUBLICATIONS

Office Action issued in corresponding Japanese Patent Application No. 2006-036847, mailed on Jan. 8, 2008.
Office Action for corresponding Chinese patent application 2007100055945; mailed Jun. 6, 2008.
Office Action mailed by Chinese Patent Office, on Nov. 14, 2008 and issued in corresponding Chinese Patent Application No. 200700055945.

* cited by examiner

*Primary Examiner*—Bentsu Ro
*Assistant Examiner*—David S Luo
(74) *Attorney, Agent, or Firm*—Staas & Halsey LLP

(57) ABSTRACT

A master unit and a plurality of slave units are connected by way of a communication path. The master unit sends to the slave units timing signals generated by its own cycle signal generator by way of a communication path. The slave units determine the cycle difference and the phase difference between a timing signal generated by its own cycle signal generator and the timing signal sent from the master unit and, in accordance therewith, determine a cycle adjustment amount. The cycle signal generators of the slave units adjust the timing signal cycle based on the cycle adjustment amount.

5 Claims, 3 Drawing Sheets

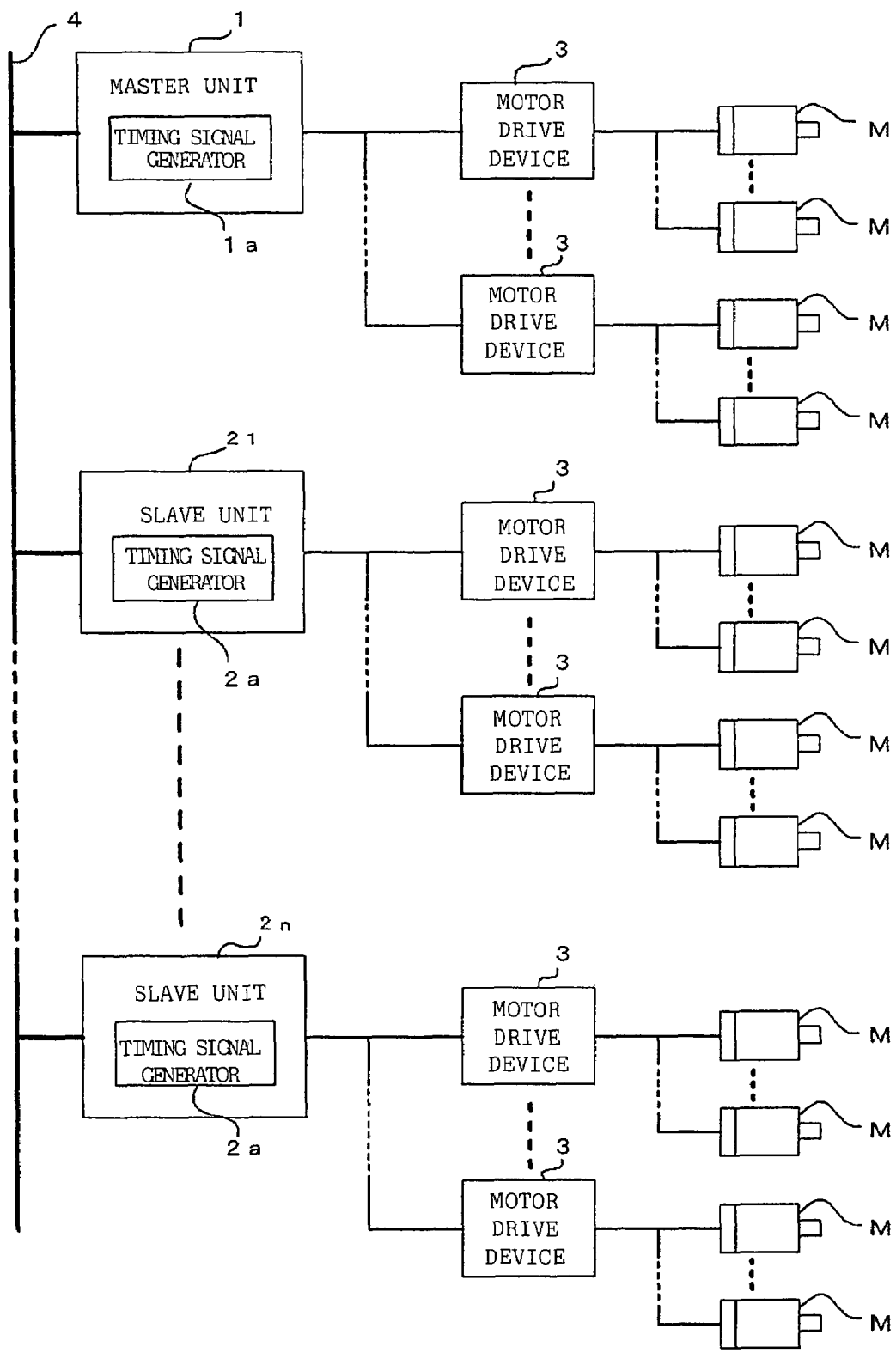

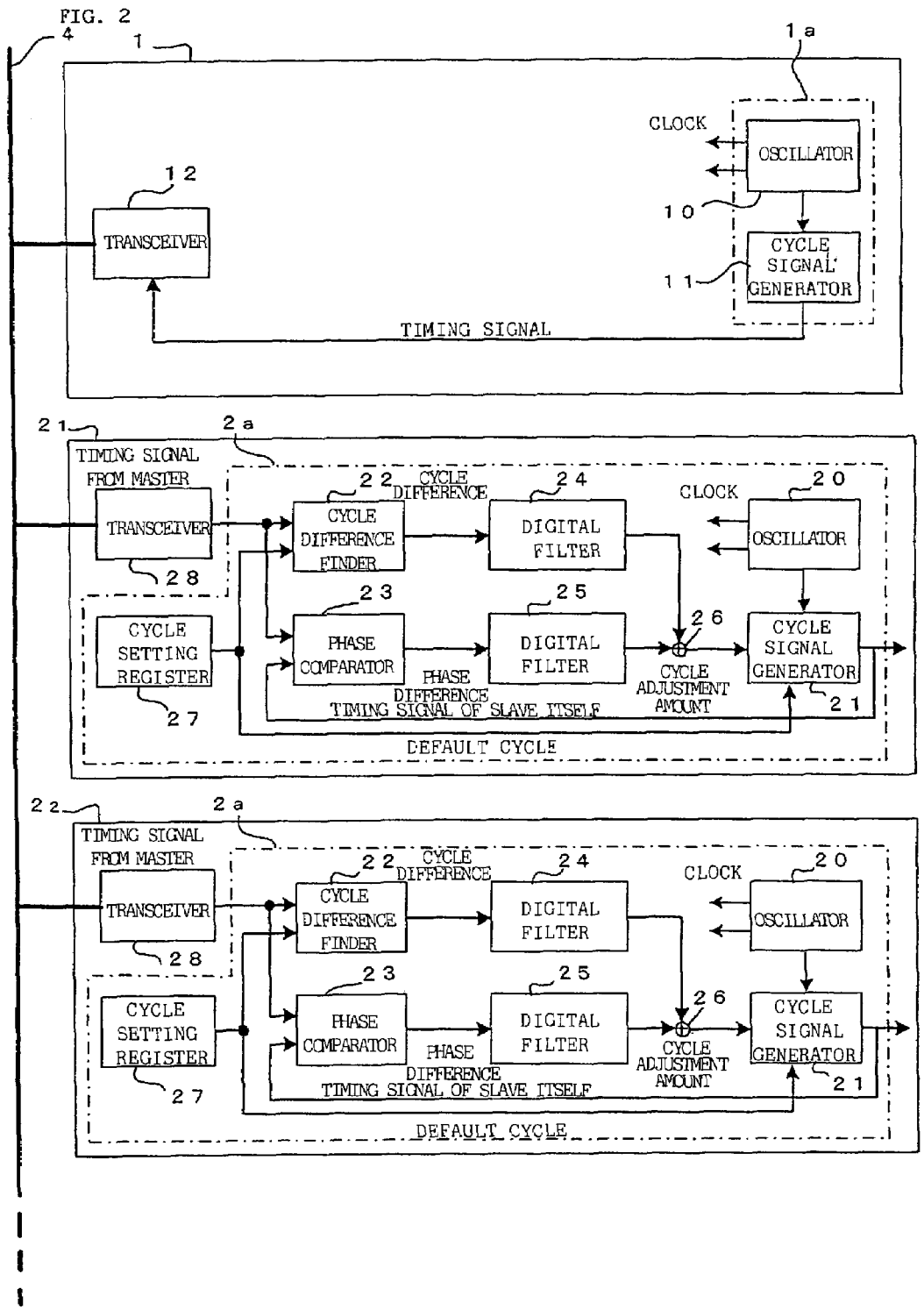

CONTROL SYSTEM

BACKGROUND OF THE INVENTION

1. Field of the Invention

The present invention relates to a synchronizing control system for a plurality of controllers.

2. Description of the Related Art

In a controller such as a numerical controller or a robot controller, the motor control is implemented in accordance with timing signals of a fixed cycle generated by the hardware of the controller, that is to say, by an interpolation cycle (ITP signal). A main CPU of the controller delivers the motion amount of each ITP signal interval to a DSP (digital signal processor) that controls a servomotor. The DSP distributes the command motion amount to each control cycle (position, speed control cycles) obtained by further subdividing of the ITP signal interval to control the position and speed of the motor.

On the other hand, a system in which a controller such as a numerical controller or robot controller is connected in plurality and a plurality of controllers are synchronously operated is also known.

In this system, a timing signal from a controller serving as a master unit is transmitted to controllers of slave units by way of a bus or a network, and motors to be driven and controlled by the controllers are synchronously operated as a result of the synchronous operation of the plurality of controllers in accordance with this timing signal.

While timing signal lag occurs in controllers of this type due to transmission delays and so on, a technique for correcting this lag to generate signals of the same timing has been disclosed (Japanese Patent Application Laid-Open No. 4-125210).

In addition, a moving body communication system in which, in the data transmission between a base station apparatus and a base station controller, the predicted arrival time of a data frame sent from the base station controller is estimated by the base station apparatus and this predicted arrival time is notified to the base station controller and, at the base station controller, the transmission timing of the data frame is sped up in accordance with this notified predicted arrival time has also been disclosed (see Japanese Patent Application Laid-Open No. 2001-358793).

As a synchronization system for a plurality of controllers such as numerical controllers or robot controllers connected by a bus or network, a patent application proposing a method for correcting timing signal synchronization lag in which the controller serving as a slave unit itself comprises timing signal generation means, and the master unit and slave unit are synchronized as a result of correction of the phase difference between a timing signal sent from the controller of the master unit and a timing signal generated by the slave unit itself has also been submitted in Japan (Japanese Patent Application Serial No. 2005-60863; disclosed as Japanese Patent Application Laid-Open No. 2006-244264 on Sep. 14, 2006).

In the invention described in Japanese Patent Application Laid-Open No. 2006-244264, the phase difference between the timing signal sent from the controller of the master unit and the timing signal generated by the slave units itself is determined, and the timing signal generated by the slave units itself is corrected so that the phase difference thereof is "0".

However, in the invention described in Japanese Patent Application Laid-Open No. 2006-244264, while the master unit and the slave unit generate their own respective timing signals that are synchronized by correction of the phase difference thereof, because the timing signals are generated by way of respectively independent timing signal generation means, there may be a case where the cycle itself of the timing signals may differ. When the timing signal cycle differs, the actuated timing of the motors driven by the controllers deviates and a stable synchronous control cannot be produced.

SUMMARY OF THE INVENTION

The present invention relates to a control system in which one controller serving as a master unit and at least one controller serving as a slave unit are connected by a communication path and motors controlled by these controllers are synchronously controlled. The master unit and the slave unit each comprise cycle signal generators for generating timing signals. The slave unit comprises correction amount generation means for receiving the timing signal generated by the cycle signal generator of the master unit, determining a phase difference and a cycle difference between the received timing signal and the timing signal generated by the cycle signal generator of the slave unit, and determining, based on the determined phase difference and cycle difference, a correction amount that allows the timing signal on the slave unit side to follow the timing signal on the master unit side. Thereupon, the cycle signal generator of the slave unit corrects a generation cycle of timing signal, based on the correction amount determined by the correction amount generation means, and outputs the corrected generation cycle of timing signal.

The controller may be a numerical controller or a robot controller.

Correction amount detection means may comprises: a phase comparator for measuring the phase difference between a timing signal sent from the master unit and received by the slave unit and a timing signal generated by the slave unit; and a cycle difference finder for measuring the cycle difference between a timing signal sent from the master unit and received by the slave unit and a timing signal generated by the slave unit, thereby generating a correction amount based on the output of the cycle difference finder and the output of the phase comparator.

Filtering means may be provided to the correction amount generation means, and the correction amount may be determined from the output of the phase comparator which has been processed by the filtering means and the output of the cycle difference finder which has been processed by the filtering means. Characteristics of the filtering means may be variable.

The present invention provides a control system in which the phase difference and cycle difference between timing signals generated by controllers are corrected. In this control system, the phase and cycle between the timing signal of the master unit and the timing signals of the slave units agree with each other and, accordingly, the motors controlled by the master unit and the slave units can be synchronously controlled with high precision.

BRIEF DESCRIPTION OF THE DRAWINGS

The objects and characterizing features described and implied by the present invention will become apparent in the explanation of the following embodiments given hereinafter with reference to the attached drawings. Of these drawings:

FIG. 1 is a schematic diagram of one embodiment of a control system according to the present invention;

FIG. 2 is a block diagram focusing on the configuration of timing signal generation units of the master unit and slave unit from which the control system shown in FIG. 1 is configured.

DESCRIPTION OF THE PREFERRED EMBODIMENTS

Figures 3A, 3B:
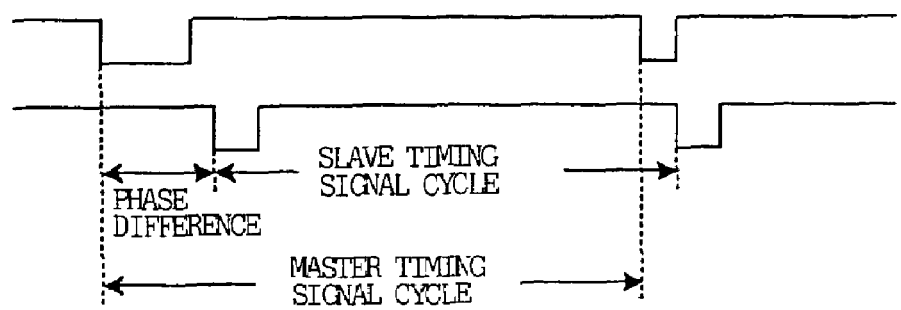
FIGS. 3A and 3B are diagrams for explaining the cycle difference and phase difference between the timing signal from the master unit and the timing signal from the slave unit itself.

FIG. 1 is a schematic diagram of one embodiment of a control system according to the present invention. A plurality of controllers including a robot controller and a controller for controlling a machine tool are connected to one another through a communication path 4 such as a serial bus or Ethernet (registered trademark). In carrying out synchronous control, one of these controllers acts as a master unit 1, while remaining controllers act as slave units 21, 22, ..., 2n.

A plurality of motor drive devices 3 are connected to the master unit 1 and, furthermore, a plurality of motors M is connected to each of the motor drive devices 3. Thereupon, the master unit 1 drives and controls the motors M to which it is connected by way of the motor drive devices 3.

A plurality of motor drive devices 3 are also similarly connected to the slave units 21, 22, ..., 2n, and a plurality of motors M are connected to each of these motor drive devices 3. Thereupon, the slave units 21, 22 ..., 2n drive and control the motors M to which they are connected by way of the motor drive devices 3.

Numerical controllers and a robot controller; which constitute a master unit 1 and slave units 21, 22 ..., 2n, are configured identical to conventional numerical controllers and robot controller, and FIG. 1 and FIG. 2 show the configuration of only the section thereof related to the present invention. As shown in FIG. 1, the master unit 1 comprises a timing signal generation unit 1a and each of the slave units 21, 22 ..., 2n also comprises a timing signal generation unit 2a.

FIG. 2 is a block diagram of the configuration of the timing signal generation units 1a and 2a related to the synchronous control of the master unit 1 and slave units 21, 22 ..., 2n.

The timing signal generation unit 1a of the master unit 1 comprises an oscillator 10 for generating a clock signal and a cycle signal generator 11 for generating timing signal of a predetermined cycle in accordance with the clock signal from the oscillator 10. Similarly to that of conventional numerical controllers or robot controllers, the master unit 1 performs an interpolated distribution of a command motion amount to the respective motors M in accordance with the timing signal generated from the cycle signal generator 11 and, as a result, the motors M are driven and controlled by way of the motor drive devices 3.

Furthermore, the timing signal from the cycle signal generator 11 of the master unit 1 is output to the communication path 4 by way of a transceiver 12.

On the other hand, the timing signal generation unit 2a provided in the slave units 21, 22 ..., 2n comprises an oscillator 20 for generating a clock signal and a cycle signal generator 21 for generating a timing signal of a predetermined cycle in accordance with this clock signal. The timing signal generation unit 2a further comprises correction amount generation means for determining the correction amount for correcting the generated cycle of the timing signal. Correction amount generation means is configured from a cycle difference finder 22, phase comparator 23, digital filters 24, 25, adder 26 and cycle setting register 27. Furthermore, the timing signal generation unit 2a is connected to a transceiver 28 connected to the communication path 4.

The cycle signal generator 21 generates a timing signal of a predetermined cycle in accordance with the clock signal generated from the oscillator 20. The control actuation of the slave units 21, 22 ..., 2n is executed in accordance with this generated timing signal whereupon, similarly to conventional numerical controllers and robot controllers, the motors M are drive-controlled by way of the motor drive devices 3 connected to the slave units 21, 22 ..., 2n.

In addition, the timing signal generated by the cycle signal generator 21 is input into the phase comparator 23. The timing signal cycle is set in the cycle setting register 27, and the default timing signal cycle set in the cycle setting register 27 is input into the cycle signal generator 21 and cycle difference finder 22. Furthermore, the timing signal from the master unit 1 received by the transceiver 28 is also input into the cycle difference finder 22 and phase comparator 23. Thereupon, the cycle difference finder 22 determines the difference (cycle time difference) between the timing signal cycle from the master unit 1 and the default timing signal cycle set in the cycle setting register 27, and outputs the determined difference.

In addition, the phase comparator 23 determines the phase difference between the timing signal from the master unit 1 and the timing signal output from the cycle signal generator 21 of the slave units 21, 22 ..., 2n themselves, and outputs the determined difference.

FIGS. 3A and 3B are explanatory diagrams of this cycle difference and phase difference. FIG. 3A shows the timing signal from the master unit 1, and FIG. 3B shows the timing signal output from the cycle signal generator 21 of the slave units 21, 22 ..., 2n. As shown in FIGS. 3A and 3B, the phase comparator 23 determines the phase difference based on the difference between the trailing edge of the timing signal from the master unit 1 (FIG. 3A) and the trailing edge of the timing signal from the cycle signal generator 21 (FIG. 3B). The cycle difference finder 22 determines the cycle difference based on the difference between the timing signal cycle (length of time between the trailing edges of the timing signal) from the master unit 1 (length of rising edge) and the default timing signal cycle set in the cycle setting register 27 of the slave unit.

The cycle difference output from the cycle difference finder 22 and the phase difference output from the phase comparator 23 are passed through digital filters 24, 25 respectively and then added together by the adder 26 to determine a cycle adjustment amount. The cycle signal generator 21 adds the determined cycle adjustment amount to the default cycle to adjust the cycle, thereby generating a timing signal.

The configuration of the phase comparator 23 is identical to the configuration for determining the phase difference between the timing signal from the master unit and the timing signal from the slave units themselves as described in Japanese Patent Application Laid-Open No. 2006-244264 mentioned above, the phase difference between the two timing signals being determined in consideration of the delay time and so on in the communication path 4 from the master unit 1 to the slave units 21, 22 ..., 2n.

In addition, the cycle difference finder 22 determines the cycle time by counting the clock signal number between trailing edges of the timing signal of the master unit 1 and further determines the difference between this determined cycle time and the default cycle as cycle difference. If the timing signal cycle of the master unit 1 is longer than the default timing signal cycle, then a positive cycle difference is output, but if it is shorter than the default timing signal cycle, on the other hand, a minus cycle difference is output.

The cycle difference output from the cycle difference finder 22 is passed through the digital filter 24 and the phase difference output from the phase comparator 23 is passed through the digital filter 25 with the object of suppressing noise. Normal data communication is also implemented using the communication path 4, and timing signals cannot be transmitted or received without delay regardless of the state of the communication path 4, and any special protocol which allows a signal to be transmitted and received without delay does not have to be used.

The digital filters 24, 25 are provided to prevent generation of variations in the arrival time of the timing signal from the master unit 1, which is to be received by the slave units 21, 22 . . . , 2n, to alleviate the effect of such disturbance on the cycle difference or phase difference, and to suppress this noise. Moreover, the characteristics of the digital filters 24, 25 are made variable so that the communication path 4 or system configuration can be adapted to these digital filters 24, 25.

The cycle difference and the phase difference are added by the adder 26 to determine the cycle adjustment amount, and the cycle signal generator 21 uses this determined adjustment amount to adjust the timing signal generation cycle.

Similarly to the invention described in Japanese Patent Application Laid-Open No. 2006-244264 mentioned above, the phase difference between the timing signal of the master unit 1 and the timing signal of the slave units 21, 22 . . . , 2n is corrected using the phase difference determined by the phase comparator 23. Furthermore, the cycle difference determined by the cycle difference finder 22 is added to this phase difference. The sum value thereof is used as the cycle adjustment amount for adjusting the generation cycle of timing signal generated by the cycle signal generator 21 of the slave units 21, 22 . . . , 2n. As a result, the phase difference and cycle difference between the timing signal of the master unit 1 and the timing signal of the slave units 21, 22 . . . , 2n themselves are adjusted to be reduced to "0", and the motors M of the master unit 1 and the slave units 21, 22 . . . , 2n are synchronized and driven and controlled with high precision.

What is claimed is:

1. A control system, comprising:
   one controller serving as a master unit; and
   at least one controller serving as a slave unit, connected to the one controller serving as a master unit by a communication path; and
   a plurality of motors synchronously controlled by the one controller serving as a master unit and the at least one controller serving as a slave unit,
   wherein the master unit and the slave unit each comprise cycle signal generators for generating timing signals,
   the slave unit comprises correction amount generation means for receiving the timing signal generated by the cycle signal generator of the master unit, determining a phase difference and a cycle difference between the received timing signal and the timing signal generated by the cycle signal generator of the slave unit, and determining, based on the determined phase difference and cycle difference, a correction amount that allows the timing signal on the slave unit side to follow the timing signal on the master unit side, and
   the cycle signal generator of the slave unit corrects a generation cycle of timing signal, based on the correction amount determined by the correction amount generation means, and outputs the corrected generation cycle of timing signal.

2. The control system according to claim 1, wherein said controllers are each one of a numerical controller or a robot controller.

3. The control system according to claim 1 or 2, wherein said correction amount detection means comprises:
   a phase comparator for measuring the phase difference between a timing signal sent from the master unit and received by the slave unit and a timing signal generated by the slave unit; and
   a cycle difference finder for measuring the cycle difference between a timing signal sent from the master unit and received by the slave unit and a timing signal generated by the slave unit, thereby generating a correction amount based on an output of the cycle difference finder and an output of the phase comparator.

4. The control system according to claim 3, wherein the correction amount generation means includes filtering means, and the correction amount is determined from the output of the phase comparator which has been processed by the filtering means and the output of the cycle difference finder which has been processed by the filtering means.

5. The control system according to claim 4, wherein characteristics of the filtering means are variable.

* * * * *